United States Patent
Fung et al.

[11] Patent Number: 5,808,952
[45] Date of Patent: Sep. 15, 1998

[54] ADAPTIVE AUTO REFRESH

[75] Inventors: Michael G. Fung, Los Altos Hills; Fukuji D. Sugie, San Jose, both of Calif.

[73] Assignee: Silicon Magic Corporation, Santa Clara, Calif.

[21] Appl. No.: 740,320

[22] Filed: Oct. 28, 1996

[51] Int. Cl.⁶ .................................................. G11C 11/401
[52] U.S. Cl. .......................................... 365/222; 365/236
[58] Field of Search ..................................... 365/222, 236, 365/189.08, 191

[56] References Cited

U.S. PATENT DOCUMENTS 5,321,661  6/1994  Iwakiri et al. ............................ 365/222
5,379,400  1/1995  Barakat et al. ........................... 365/222
5,446,695  8/1995  Douse et al. ............................. 365/222
5,619,468  4/1997  Ghosh et al. ............................ 365/222

*Primary Examiner*—Tan T. Nguyen
*Attorney, Agent, or Firm*—Sawyer & Associates

[57] ABSTRACT

A system and method for automatically refreshing a dynamic random access memory is disclosed. The system comprises a timer, a trigger, and refresh generation means coupled to the timer and the trigger. The timer provides a first refresh rate. The first refresh rate is a required number of refreshes for a particular interval of time. The trigger provides a trigger signal. The trigger signal is a periodic signal. The refresh generation provide a plurality of refreshes at a second refresh rate in response to the trigger signal. The system functions such that the second refresh rate adapts to the first refresh rate.

46 Claims, 2 Drawing Sheets

ADAPTIVE AUTO REFRESH

FIELD OF THE INVENTION

The present invention relates to a method and system for refreshing dynamic random access memory ("DRAM") and more particularly to a method and system for providing a refresh of a DRAM that can be adapted to the requirements of the particular DRAM and a variable trigger signal.

BACKGROUND OF THE INVENTION

Typical dynamic random access memory ("DRAM") arrays store data such that the information will degrade if not rewritten, or refreshed, after a particular interval. For example, a DRAM may store data as a charge on a capacitor. If the capacitor is not periodically recharged, the charge will dissipate and the data will be lost. The DRAM is refreshed by reading the DRAM and rewriting the data back into the DRAM. Because the DRAM must be periodically refreshed, some conventional systems employ auto refresh, where refresh requests are automatically generated from an internal clock signal.

Conventional display controllers perform auto refresh operations during the horizontal blanking interval of the display. The horizontal blanking interval occurs when the cathode ray tube sweeps from the right edge of the display back to the left edge. In such a system, the refresh requests are generated from the horizontal synchronization ("HSYNC") pulse which occurs at a frequency of approximately 30–80 kilohertz ("kHz"). However, typical DRAMs require refreshes at a rate of approximately 64 kHz.

Because the DRAM may require refreshes more than once per cycle of the HSYNC, multiple refreshes may be generated during a single display cycle. Consequently, although the refreshes are performed periodically, the refreshes may also be performed in bursts. The refresh rate, therefore, typically refers to the total number of refreshes that may be performed within a particular time interval. There is no requirement that the refreshes be evenly spaced throughout the particular time interval. In addition, where a particular system accesses only a portion of the memory cells in the DRAM during a single refresh, multiple refresh requests must be provided during a single display cycle.

Conventional systems using the HSYNC pulse as a trigger function adequately. However, when the HSYNC pulse is generated at higher frequencies, the DRAM is refreshed more often than necessary. Thus, power and memory bandwidth are consumed unnecessarily. In addition, if the display is disabled, the HSYNC may also be disabled. If an alternate method of generating refresh requests is not provided, the DRAM will be unable to retain stored information.

Accordingly, what is needed is a system and method for providing a refresh of a DRAM which reduces the unnecessary consumption of power and memory bandwidth. The present invention addresses such a need.

SUMMARY OF THE INVENTION

The present invention provides a method and system for automatically refreshing a dynamic random access memory. The system comprises a timer, a trigger, and refresh generation means coupled to the timer and the trigger. The timer provides a first refresh rate. The first refresh rate is a required number of refreshes within a particular interval of time. The trigger provides a trigger signal. The trigger signal is typically but not necessarily a periodic signal. The refresh generation means provide a plurality of refreshes in response to the trigger signal at a second refresh rate. The second refresh rate adapts to the first refresh rate.

According to the system and method disclosed herein, the present invention is capable of using less power and consuming less memory bandwidth than conventional systems and methods for generating refresh requests, thereby increasing overall system performance.

DETAILED DESCRIPTION OF THE INVENTION

Figure 1:
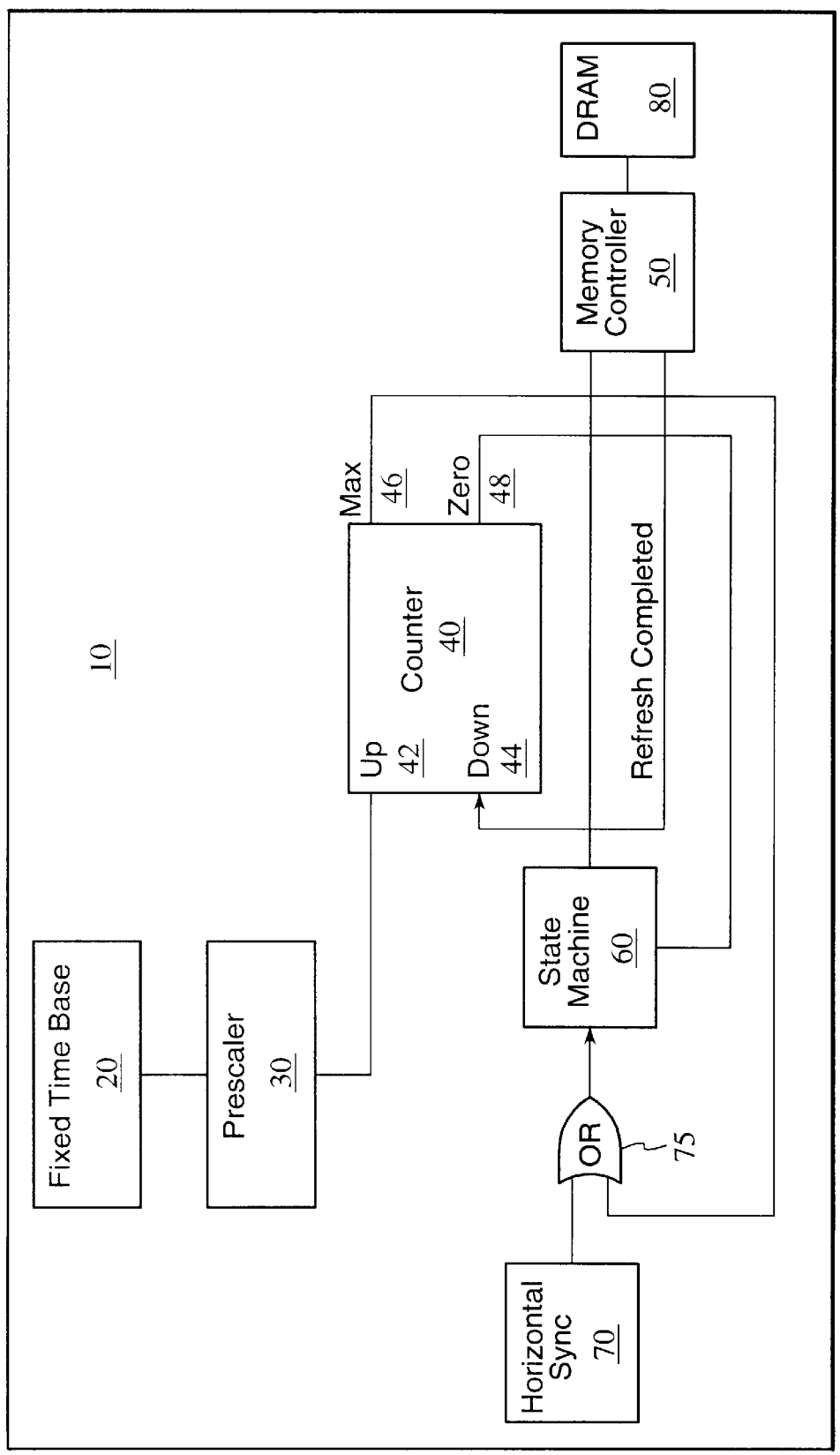
FIG. 1 is a block diagram of a system in accordance with the method and system for generating refresh requests for DRAM.

The present invention relates to an improvement in dynamic random access memory ("DRAM") refresh generation. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein. In addition, reference is made to the use of a horizontal synchronization pulse for triggering the refresh. However, this does not preclude the use of other triggering signals.

Typical dynamic random access memory ("DRAM") arrays store data such that the information will degrade if not periodically refreshed. The DRAM is refreshed by reading the DRAM and rewriting the data back into the DRAM. For example, a DRAM may store data as a charge on a capacitor. If the capacitor is not recharged by a refresh operation, the charge will dissipate and the data will be lost Conventional low power DRAMs are refreshed using a "self-refresh" in which a timer internal to the device generates refresh requests. In such a device, a fixed number of refresh requests are generated for a given period. Typical implementations of a self-refresh utilize internal oscillators in the timing system generating the refresh requests.

However, one of ordinary skill in the art will realize that at higher temperatures, where refresh requests must be generated more frequently, the internal oscillators run more slowly. Because this worst case must be accounted for when determining the number of refresh requests for a given period of time, conventional systems generate refresh requests more often than necessary. Thus, at lower temperatures, conventional self-refresh systems consume more power than required for the minimum required number of refreshes at normal operating temperatures.

Other systems employ auto-refresh to automatically refresh the DRAM. For example, conventional display controllers perform the auto-refresh operation during the horizontal blanking interval of the display. The horizontal blanking interval occurs when the cathode ray tube sweeps from the right edge of the display back to the left edge.

In a system performing the refresh during the horizontal blanking interval, the refresh requests are triggered by the horizontal synchronization pulse ("HSYNC"). Although the HSYNC pulse is periodic, the frequency of the HSYNC pulse can vary between approximately 30–80 kilohertz ("kHz") depending on display resolution. In addition, the HSYNC pulse may be disabled if the display is turned off. However, typical DRAMs require refreshes at a rate of approximately 64 kHz.

Because the DRAM may require refreshes more often than once per cycle of the HSYNC, multiple refreshes may be generated during a single display cycle. The refresh rate, therefore, refers to the total number of refreshes that may be performed within a particular time interval. There is, however, no requirement that the refreshes be evenly spaced throughout the particular time interval. In addition, a particular system may access only a portion of the memory cells in the DRAM during a single refresh, thereby requiring multiple refreshes during a single HSYNC cycle.

One of ordinary skill in the art will realize that when the HSYNC pulse is generated at higher frequencies, the DRAM is refreshed more often than necessary. Thus, power is consumed unnecessarily. Because the refresh utilizes a portion of the memory bandwidth, the system will also needlessly consume valuable memory bandwidth at higher HSYNC frequencies. In addition, if the display is disabled, the HSYNC may also be disabled. Unless an alternate method of generating refresh requests is provided, the DRAM will be unable to retain stored information.

The present invention provides for a method and system for an adaptive auto-refresh. The method and system provide the correct number of refreshes for a particular time interval at all operating frequencies of the HSYNC.

To more particularly illustrate the method and system in accordance with the present invention, refer now to FIG. 1 depicting a block diagram of a system for generating refresh requests in accordance with the method and system. The system is comprised of clock 20, prescalar 30, counter 40, memory controller 50, HSYNC generator 70, is the trigger for providing a trigger signal and DRAM 80. Although the embodiment shown in FIG. 1 also includes an OR gate 75, the OR gate 75 is not necessary for operation of the system 10. The clock 20 provides a fixed time base, for example a fixed time base may be provided by a 14 Megahertz (MHZ) clock.

In order to determine the number of refreshes per time interval that the DRAM 80 requires, prescalar 30 divides the fixed time base into increments sufficient to provide refreshes at the desired rate. For typical DRAMs, the desired refresh rate is approximately 64 kHz. The desired number of refreshes per unit time is determined once for a particular DRAM 80 to be refreshed by the system 10, for example by referencing the specifications for the DRAM 80. This number includes the number of refreshes required to refresh every memory cell in the DRAM array. For example, one embodiment of the method and system accesses half of the memory cells in DRAM 80. In order to account for this, the DRAM 80 must be accessed twice for every refresh required. In one embodiment, therefore, the DRAM 80 is refreshed twice per cycle, with cycles occurring at a frequency of 64 kHz. Consequently, the system 10 accounts for the number of memory cells accessed during a single refresh.

The signal from prescalar 30 is routed to counter 40 through up input 42. Consequently, prescalar 30 provides counter 40 with a constant clock signal which will cause counter 40 to accumulate a number of refresh requests during a given time interval required to refresh the DRAM 80. The counter 40 is capable of accumulating the required number of refreshes without overflowing. In the embodiment shown in FIG. 1, the counter 40 is coupled through the state machine 60 to the HSYNC 70.

Figure 2:
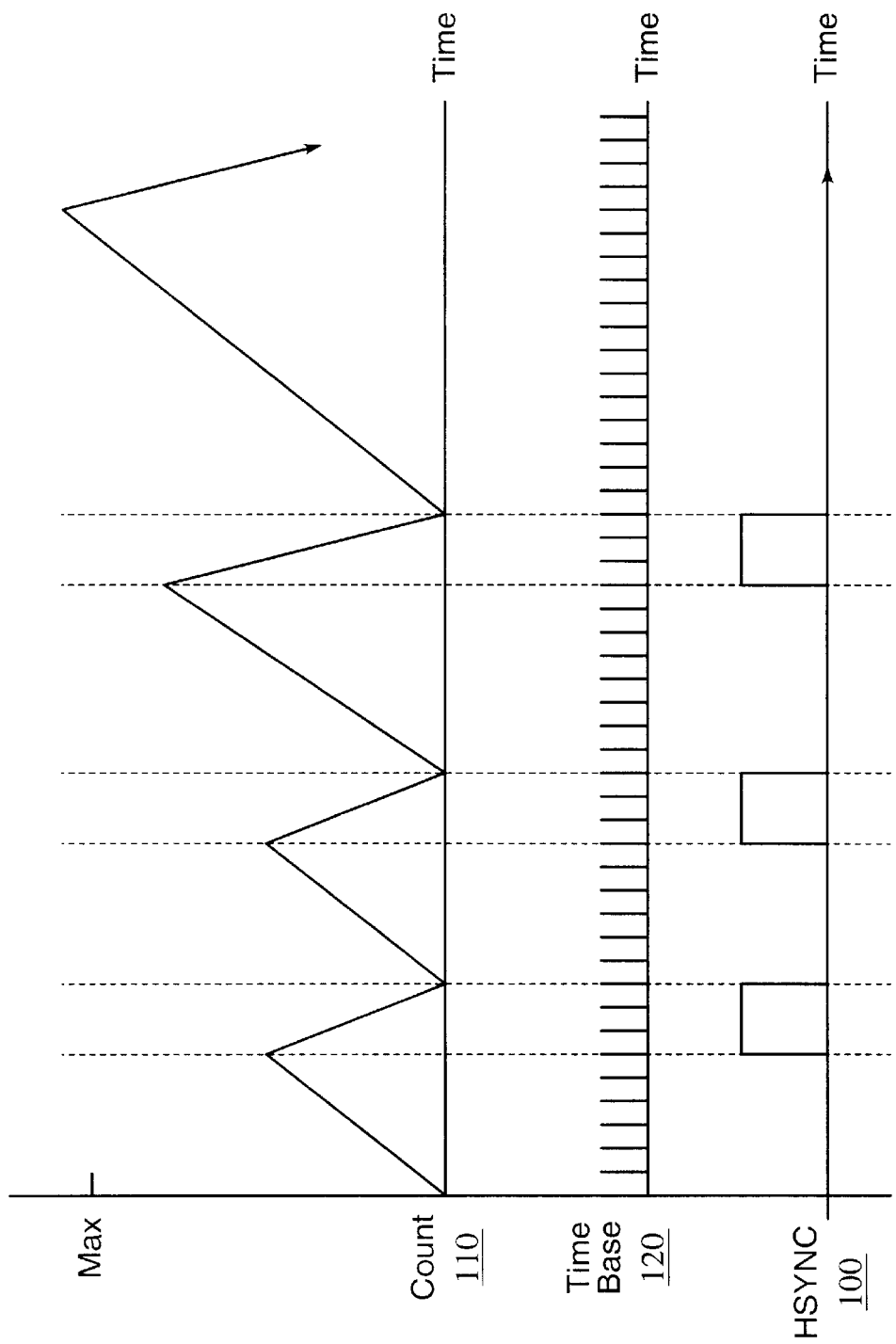
FIG. 2 is a graph of the synchronization between the HSYNC pulse and a counter vs. time in accordance with one embodiment of the method and system.

FIG. 2 displays a graph showing the synchronization of HSYNC pulse versus time 100, the count versus time 110 of counter 40, and the time base 120 provided by the prescalar 30. During the time that the CRT sweeps from left to right on the display, counter 40 increments the count. Thus, the counter 40 increments the count prior to the generation of an HSYNC pulse. Because of the rate set by prescalar 30 and clock 20, the counter 40 counts up to the required number of refreshes during this time. Upon the generation of an HSYNC pulse, which references the start of the horizontal blanking period, the state machine 60 enables the memory controller 50 to begin refreshing DRAM 80. Counter 40 counts down for each refresh generated. Consequently, the slope of the count versus time 100 displayed in FIG. 2 changes sign after the leading edge of the HSYNC pulse. However, nothing prevents the change in slope of the count versus time from changing sign based on the trailing edge of the HSYNC pulse.

Referring back to FIG. 1, for each refresh request completed by the memory controller 50, a signal is provided to counter 40 through the down input 44. Each refresh request results in a refresh being performed on at least a portion of DRAM 80. In addition, each refresh causes the counter 40 to decrement the count. Typically refresh cycles should be completed at a faster rate than requested to ensure proper operation. The memory controller 50 continues to generate refresh requests until the counter 40 has been decremented to zero. Once the counter 40 reaches zero, the state machine is notified by a signal from zero output 48. The state machine 60 then causes the memory controller to stop generating refresh requests. The count is incremented until the next HSYNC pulse is generated.

Because the system 10 has an independent measure of the required rate of refreshes and is triggered off of an HSYNC pulse, the system 10 will generate the appropriate number of refreshes for the DRAM 80 for all frequencies of the HSYNC pulse. For example, if the DRAM 80 must be refreshed at a rate of 64 kHz and the frequency of the HSYNC pulses is 32 kHz, system 10 ensures that counter 40 will count up to 2 between HSYNC pulses. During each horizontal blanking period, the memory controller 50 provides two refresh requests, causing the counter 40 to decrement to zero. Thus, the system 10 will refresh the DRAM 80 at a rate of 64 kHz. Suppose now that the frequency of the HSYNC pulses is 80 kHz. Because the DRAM 80 only requires refreshes at a rate of 64 kHz, the clock 20 and prescalar 30 still provide counter 40 with a signal corresponding to 64 kHz. The counter 40 will only count up to 0.8 during a single HSYNC period. Because of this, counter 40 will decrement only four times out of every five HSYNC pulse periods. Consequently, the system 10 will still provide refreshes at a rate of only 64 kHz. Because the system 10 provides refreshes to DRAM 80 at a constant rate, no unnecessary refreshes are generated. Thus, memory bandwidth is conserved and power consumption is reduced.

FIG. 2 also displays the ability of one embodiment of the system's 10 to adapt to different HSYNC frequencies while providing the requisite refresh rate. The first two pulses shown in the HSYNC versus time 100 have the same frequency. The third pulse, however, has a larger period. Thus, the second and third HSYNC pulses are farther apart along the time axis than the first two pulses. Because the prescalar 30 provides a fixed time base 120 to the counter 40, the count versus time 110 is larger when refreshes are triggered by the third (lower frequency) HSYNC pulse. Consequently, the number of refreshes provided in response to the third HSYNC will be greater than the number of refreshes provided in response to either of the first two HSYNC pulses. The refresh rate is, therefore, similar for all three HSYNC pulses despite the change in the HSYNC frequency.

Referring back to FIG. 1, if the HSYNC 70 is shut off, for example by turning the display off, the state machine 60 will not change the state of the counter 40. Thus, the counter 40 will not decrement the count. This causes the counter 40 to reach the maximum count and overflow. When the counter 40 overflows, the trigger pulse is generated and the refresh is generated, system 10 automatically refreshes the DRAM 80 at a preset rate. Thus, even if the display is shut off, the DRAM 80 will automatically continue to be refreshed at the required rate.

In the embodiment of FIG. 1, when the counter 40 overflows, the counter notifies the state machine 60 through max output 46. In response, the state machine causes the memory controller 50 to begin refreshing the DRAM 80. In response to each refresh request generated by memory controller 50, counter 40 decrements the count. When the count reaches zero, the counter 40 notifies the state machine 60 through zero output 48. The state machine 60 then causes memory counter 50 to stop issuing refresh requests. The counter 40 then continues incrementing the count. In one embodiment, this process is repeated until another HSYNC pulse is generated. Thus, the DRAM 80 continues to be refreshed even in the absence of an HSYNC pulse. It should be understood in normal operation that the count down rate should be faster than the count up rate.

In FIG. 2, the display is turned off after the third HSYNC pulse. Because of this, no further HSYNC pulses are generated. The count versus time 110 continues to increment until the maximum count is reached. Because of the process described in the preceding paragraph, the counter then begins decrementing the count in response to refresh cycles that have been completed by the memory controller 50. The slope of the count versus time 110 thus changes sign when the maximum count is reached. Consequently, refreshes continue to be provided at the appropriate rate even though the display has been turned off.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for automatically refreshing a dynamic random access memory comprising:
   a timer for providing a first refresh rate, the first refresh rate being a required number of refreshes for a particular interval of time;
   a trigger for providing a trigger signal the trigger signal being a periodic signal having a trigger signal rate; and
   refresh generation means coupled to the trigger and the timer for providing a plurality of refreshes at a second refresh rate;
   such that the second refresh rate adapts to the first refresh rate in response to the trigger signal rate.

2. The system of claim 1 wherein the refresh generation means further generate refreshes at a third refresh rate when the trigger is disabled, the third refresh rate being at least the first refresh rate.

3. The system of claim 2 wherein the trigger signal is variable.

4. The system of claim 3 wherein the required number of refreshes per the particular interval of time further comprises a plurality of refreshes for each occurrence of the trigger signal.

5. The system of claim 4 wherein the refresh generation means further comprises:
   a counter coupled to the timer for counting the required number of refreshes, the counter counting at the first refresh rate; and
   a controller coupled to the counter for providing a plurality of refreshes at the second refresh rate.

6. The system of claim 5 wherein the refresh generation means further comprises a state machine coupled to the trigger and the counter, for changing a state of the counter in response to the trigger signal.

7. The system of claim 6 wherein the timer further comprises:
   a clock for generating a first rate; and
   a prescalar coupled to the clock, for scaling the first rate to the first refresh rate.

8. The system of claim 7 wherein an overflow signal from the counter is generated when the trigger is disabled.

9. A system for automatically refreshing a dynamic random access memory comprising:
   a timer for providing a first refresh rate, the first refresh rate being a required number of refreshes for a particular interval of time;
   a counter coupled to the timer for counting the required number of refreshes, the counter counting at the first refresh rate;
   a trigger coupled to the counter for providing a trigger signal, the trigger signal being a periodic signal; and
   a controller coupled to the counter for providing a plurality of refreshes at a second refresh rate in response to the trigger signal such that the second refresh rate adapts to the first refresh rate.

10. The system of claim 9 wherein the controller further generates refreshes when the trigger is disabled at a third refresh rate, the third refresh rate being at least the first refresh rate.

11. The system of claim 10 wherein an overflow signal from the counter is generated when the trigger is disabled.

12. The system of claim 11 wherein the trigger signal is variable.

13. The system of claim 12 wherein the required number of refreshes per the particular interval of time further comprises a plurality of refreshes for each occurrence of the trigger signal.

14. The system of claim 13 wherein the counter further comprises a state machine, for causing refreshes to be performed to cause the counter to count down in response to the trigger signal.

15. The system of claim 14 wherein the timer further comprises: a clock for generating a first rate; and
   a prescalar coupled to the clock for scaling the first rate to the first refresh rate.

16. A system for automatically refreshing a dynamic random access memory comprising:
   a timer for providing a first refresh rate, the first refresh rate being a required number of refreshes for a particular interval of time;

counting means coupled to the timer for counting the required number of refreshes;

a trigger coupled to the counter for providing a trigger signal the trigger signal being a periodic signal; and a controller coupled to the counter for providing a plurality of refreshes at a second refresh rate in response to the trigger signal, such that the second refresh rate adapts to the first refresh rate.

17. The system of claim 16 wherein the controller further generates refreshes at a third refresh rate when the trigger is disabled, the third refresh rate being at least the first refresh rate.

18. The system of claim 17 wherein when the trigger is disabled an overflow signal is generated that indicates that the counting means has reached a maximum count.

19. The system of claim 18 wherein the trigger signal is variable.

20. The system of claim 19 wherein the counting means further comprises a counter coupled to the timer.

21. The system of claim 20 wherein the counting means further comprises a state machine coupled to the counter and the trigger, the state machine for causing refreshes to be performed to cause the counter to count down in response to the trigger signal.

22. The system of claim 21 wherein the timer further comprises a clock for generating a first rate; and a prescalar coupled to the clock for scaling the first rate to the first refresh rate.

23. The system of claim 22 wherein the required number of refreshes per the particular interval of time further comprises a plurality of refreshes for each occurrence of the trigger signal.

24. A method for automatically refreshing a dynamic random access memory comprising the steps of:

a) providing a timer, the timer for providing a first refresh rate, the first refresh rate being a required number of refreshes for a particular interval of time;

b) providing a trigger, the trigger for providing a trigger signal, the trigger signal being a periodic signal having a trigger signal rate; and c) providing refresh generation means coupled to the trigger and the timer, the refresh generation means for providing a plurality of refreshes at a second refresh rate, such that the second refresh rate adapts to the first refresh rate in response to the trigger signal rate.

25. The method of claim 24 wherein the refresh generation means providing step (c) further comprises the step of:

c1) providing refresh generation means capable of generating refreshes at a third refresh rate when the trigger is disabled, the third refresh rate being at least the first refresh rate.

26. The method of claim 25 wherein the trigger signal is variable.

27. The method of claim 26 wherein the required number of refreshes per the particular interval of time further comprises a plurality of refreshes for each cycle of the trigger signal.

28. The method of claim 27 wherein the refresh generation means providing step (c) further comprises the steps of:

c2) providing a counter coupled to the timer for counting the required number of refreshes, the counter counting at the first refresh rate; and c3) providing a controller coupled to the counter, the controller for providing a plurality of refreshes at the second refresh rate.

29. The method of claim 28 wherein the refresh generation means providing step (c) further comprises the step of:

c4) providing a state machine coupled to the trigger and the counter, the state machine for causing the counter to count up or down in response to the trigger signal.

30. The method of claim 29 wherein timer providing step (a) further comprises the steps of:

a1) providing a clock for generating a first rate; and a2) providing a prescalar coupled to the clock, the prescalar for scaling the first rate to the first refresh rate.

31. The method of claim 30 wherein when an overflow signal from the counter is generated when the trigger is disabled.

32. A method for automatically refreshing a dynamic random access memory comprising the steps of:

a) providing a timer for providing a first refresh rate, the first refresh rate being a required number of refreshes for a particular interval of time;

b) providing a counter coupled to the timer for counting the required number of refreshes, the counter counting at the first refresh rate;

c) providing a trigger coupled to the counter, the trigger for providing a trigger signal; and d) providing a controller coupled to the counter, the controller for providing a plurality of refreshes at a second refresh rate in response to the trigger signal, such that the second refresh rate adapts to the first refresh rate.

33. The method of claim 32 further comprising the step of:

e) coupling the controller, the counter, and the trigger to be capable of generating refreshes at a third refresh rate when the trigger is disabled, the third refresh rate being at least the first refresh rate.

34. The method of claim 33 wherein an overflow signal from the counter is generated when the trigger is disabled.

35. The method of claim 34 wherein the trigger signal is variable.

36. The method of claim 35 wherein the required number of refreshes per the particular interval of time further comprises a plurality of refreshes for each cycle of the trigger signal.

37. The method of claim 36 wherein counter providing step (b) further comprises the step of providing a state machine, the state machine for causing refreshes to be performed to cause the counter to count down in response to the trigger signal.

38. The method of claim 37 wherein timer providing step (a) further comprises the steps of:

a1) providing a clock, the clock for generating a first frequency; and a2) providing a prescalar coupled to the clock, the prescalar for scaling the first frequency to the first refresh rate.

39. A method for automatically refreshing a dynamic random access memory comprising the steps of:

a) providing a timer, the timer for providing a first refresh rate, the first refresh rate being a required number of refreshes for a particular interval of time;

b) providing counting means coupled to the timer, the counting means for counting the required number of refreshes;

c) providing a trigger coupled to the counter, the trigger for providing a trigger signal the trigger signal being a periodic signal; and d) providing a controller coupled to the counter, the controller for providing a plurality of refreshes at a second refresh rate in response to the trigger, such that the second refresh rate adapts to the first refresh rate.

40. The method of claim 39 further comprising the step of:

e) coupling the counting means, the trigger, and the controller to be capable of generating refreshes at a third refresh rate when the trigger is disabled, the third refresh rate being at least the first refresh rate.

41. The method of claim 40 wherein the trigger signal is variable.

42. The method of claim 41 wherein the required number of refreshes per the particular interval of time further comprises a plurality of refreshes for each occurrence of the trigger signal.

43. The method of claim 42 wherein a signal indicating the counting means has reached the maximum count generated when the trigger is disabled.

44. The method of claim 43 wherein counting means providing step (b) further comprises the step of:

b1) providing a counter coupled to the timer, the counter for counting the required number of refreshes.

45. The method of claim 44 wherein the counting means providing step (b) further comprises the step of:

b2) providing a state machine coupled to the counter and the trigger, the state machine for causing refreshes to be performed to cause the counter to count down in response to the trigger signal.

46. The method of claim 45 wherein timer providing step (a) further comprises the steps of:

a1) providing a clock for generating a first frequency; and a2) providing a prescalar coupled to the clock for scaling the first frequency to the first refresh rate.

* * * * *